United States Patent
Braman et al.

(10) Patent No.: US 9,625,284 B2
(45) Date of Patent: Apr. 18, 2017

(54) SHOCK MOUNT IN ENVIRONMENT SENSOR PROTECTOR FOR NON-ISOLATED SYSTEMS

(71) Applicant: Honeywell International Inc., Morristown, NJ (US)

(72) Inventors: Todd Loren Braman, New Brighton, MN (US); Scott James Goepfert, White Bear Lake, MN (US); Terrance Troske, White Bear Lake, MN (US)

(73) Assignee: Honeywell International Inc, Morris Plains, NJ (US)

( * ) Notice: Subject to any disclaimer, the term of this patent is extended or adjusted under 35 U.S.C. 154(b) by 0 days.

(21) Appl. No.: 14/846,047

(22) Filed: Sep. 4, 2015

(65) Prior Publication Data

US 2017/0067759 A1    Mar. 9, 2017

(51) Int. Cl.
*G01D 11/24* (2006.01)
*G01D 11/10* (2006.01)
*F16M 13/02* (2006.01)

(52) U.S. Cl.
CPC ............. *G01D 11/10* (2013.01); *F16M 13/02* (2013.01); *G01D 11/245* (2013.01)

(58) Field of Classification Search
CPC ............................... G01D 11/24; G01D 11/245
USPC ......................................................... 73/431
See application file for complete search history.

(56) References Cited

U.S. PATENT DOCUMENTS

| 4,681,293 A | 7/1987 | Cucci et al. |
|---|---|---|
| 5,878,980 A | 3/1999 | Cooley, Jr. |
| 5,890,569 A | 4/1999 | Goepfert |
| 5,927,680 A | 7/1999 | Bridges et al. |
| 6,578,682 B2 | 6/2003 | Braman et al. |
| 7,166,911 B2 | 1/2007 | Karpman et al. |
| 7,404,324 B2 | 7/2008 | Braman et al. |

(Continued)

FOREIGN PATENT DOCUMENTS

| EP | 1788277 | 5/2007 |
|---|---|---|
| WO | 9855832 | 12/1998 |

OTHER PUBLICATIONS

European Patent Office, "Office Action from EP Application No. 13184467.2 mailed Oct. 6, 2014", from Foreign Counterpart of U.S. Appl. No. 13/628,911, Oct. 6, 2014, pp. 1-3, Published in: EP.

(Continued)

*Primary Examiner* — Lisa Caputo
*Assistant Examiner* — Jamel Williams
(74) *Attorney, Agent, or Firm* — Fogg & Powers LLC

(57) ABSTRACT

A shock mount assembly for a sensor protector apparatus is provided. The shock mount assembly comprises a support structure having a geometric configuration, with the support structure including at least one side wall having an outer edge section that defines a periphery of the support structure, and at least one mounting surface substantially perpendicular to the side wall. The mounting surface is configured for coupling at least one electronic device to the support structure. A shock absorber is mounted to at least a portion of the outer edge section, with the shock absorber substantially surrounding the periphery of the support structure. The shock mount assembly is configured for a non-isolated system, and is configured to protect the electronic device during vibration or shock events.

20 Claims, 6 Drawing Sheets

(56) References Cited

U.S. PATENT DOCUMENTS

| | | |
|---|---|---|
| 7,584,660 B2 | 9/2009 | Lysen |
| 7,883,071 B2 | 2/2011 | Fox et al. |
| 8,266,960 B2 | 9/2012 | Braman et al. |
| 8,931,765 B2 * | 1/2015 | Braman ............... B81B 7/0016 |
| | | 267/136 |
| 2002/0113191 A1 | 8/2002 | Rolt et al. |
| 2003/0014874 A1 * | 1/2003 | Brunstein ............... G01C 21/16 |
| | | 33/318 |
| 2004/0150144 A1 | 8/2004 | Goepfert et al. |
| 2007/0045070 A1 | 3/2007 | Damien |
| 2007/0113702 A1 * | 5/2007 | Braman ................. F16F 15/08 |
| | | 74/574.4 |
| 2010/0037694 A1 * | 2/2010 | Grossman ............ F16F 15/046 |
| | | 73/526 |
| 2010/0059911 A1 * | 3/2010 | Goepfert ............ F16F 15/0232 |
| | | 267/140.11 |
| 2010/0251817 A1 | 10/2010 | Ge et al. |
| 2010/0257932 A1 * | 10/2010 | Braman ................. G01P 1/023 |
| | | 73/493 |
| 2010/0264572 A1 | 10/2010 | Konkle |
| 2010/0300201 A1 | 12/2010 | Ge et al. |
| 2012/0085170 A1 | 4/2012 | Letterneau |
| 2014/0001687 A1 * | 1/2014 | Braman ................. F16F 15/08 |
| | | 267/141.2 |
| 2016/0103145 A1 * | 4/2016 | Braman ................. G01P 1/023 |
| | | 73/431 |

OTHER PUBLICATIONS

European Patent Office, "European Search Report for Application No. 13184467.2", from Foreign Counterpart U.S. Appl. No. 13/628,911, Sep. 15, 2014, pp. 1-3, Published in: EP.

U.S. Patent and Trademark Office, "Notice of Allowance", from U.S. Appl. No. 13/628,911, Sep. 10, 2014, pp. 1-5, Published in: US.

U.S. Patent Office, "Office Action", from U.S. Appl. No. 13/628,911, Apr. 11, 2014, pp. 1-13, Published in: US.

* cited by examiner

SHOCK MOUNT IN ENVIRONMENT SENSOR PROTECTOR FOR NON-ISOLATED SYSTEMS

BACKGROUND

Inertial sensor systems used in guidance applications are exposed to environments such as vibration, shock, and static acceleration. These systems require some form of protection to both function properly and minimize the risk of damage in these environments. Typically an isolation system is used to reduce the energy the sensors get exposed to during these events, but such isolation systems come with their own disadvantages. In extreme environments the isolation system can be displaced beyond its capability (i.e., sway space) and bottom out, which can greatly amplify the input. Under these conditions, these amplified events can cause sensor performance degradation as well as component damage which result in a system failure. Isolation systems also allow the inertial sensors to move independently from the device in which the sensors are being used for guidance, such as aircraft, missiles, projectiles, trains, boats, cars, and the like. This can cause system errors and reduce the type of application for which the isolated systems can be used.

Another obstacle with typical isolation systems is getting the heat from an isolated portion of the device to an un-isolated portion of the device. The typical temperature delta across an isolation system is about 15° C., and in some cases can exceed 25° C. With this additional temperature on the isolated portion of the device, higher rated parts, reduced mean time between failures (MTBF) rating, and/or reduced temperature ranges are required to meet system requirements.

SUMMARY

A shock mount assembly for a sensor protector apparatus is provided. The shock mount assembly comprises a support structure having a geometric configuration, with the support structure including at least one side wall having an outer edge section that defines a periphery of the support structure, and at least one mounting surface substantially perpendicular to the side wall. The mounting surface is configured for coupling at least one electronic device to the support structure. A shock absorber is mounted to at least a portion of the outer edge section, with the shock absorber substantially surrounding the periphery of the support structure. The shock mount assembly is configured for a non-isolated system, and is configured to protect the electronic device during vibration or shock events.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A shock mount assembly such as for an environment sensor protector in a non-isolated system is described herein. The shock mount assembly is configured to protect internal sensors of a sensor assembly from both damage and degradation in sensor performance during vibration and shock events. The shock mount assembly generally includes a shock absorber (or spring mass damper) coupled to a mount structure with a specified geometric configuration. The shock absorber acts as a frequency filter to protect sensors from vibrations or shocks.

The shock mount assembly in an environment sensor protector provides an improved level of environmental protection without the need of having a typical sensor isolation system. For example, use of the shock mount assembly enables an inertial sensor system to meet various operational requirements in typical non-operating and operating environments. This improved performance, without the need of a sensor isolation system, allows the inertial sensor system to be coupled to a use device, and therefore, better measure the actual movement of the device, and not just the movement of the sensors.

The shock mount assembly can provide protection for an inertial sensor assembly having 6 degrees of freedom, without the need of additional clearance for sway space (free motion). The shock mount assembly can also be employed in systems that require higher bandwidth sensor performance, such as pointing and tracker devices.

Figure 1:
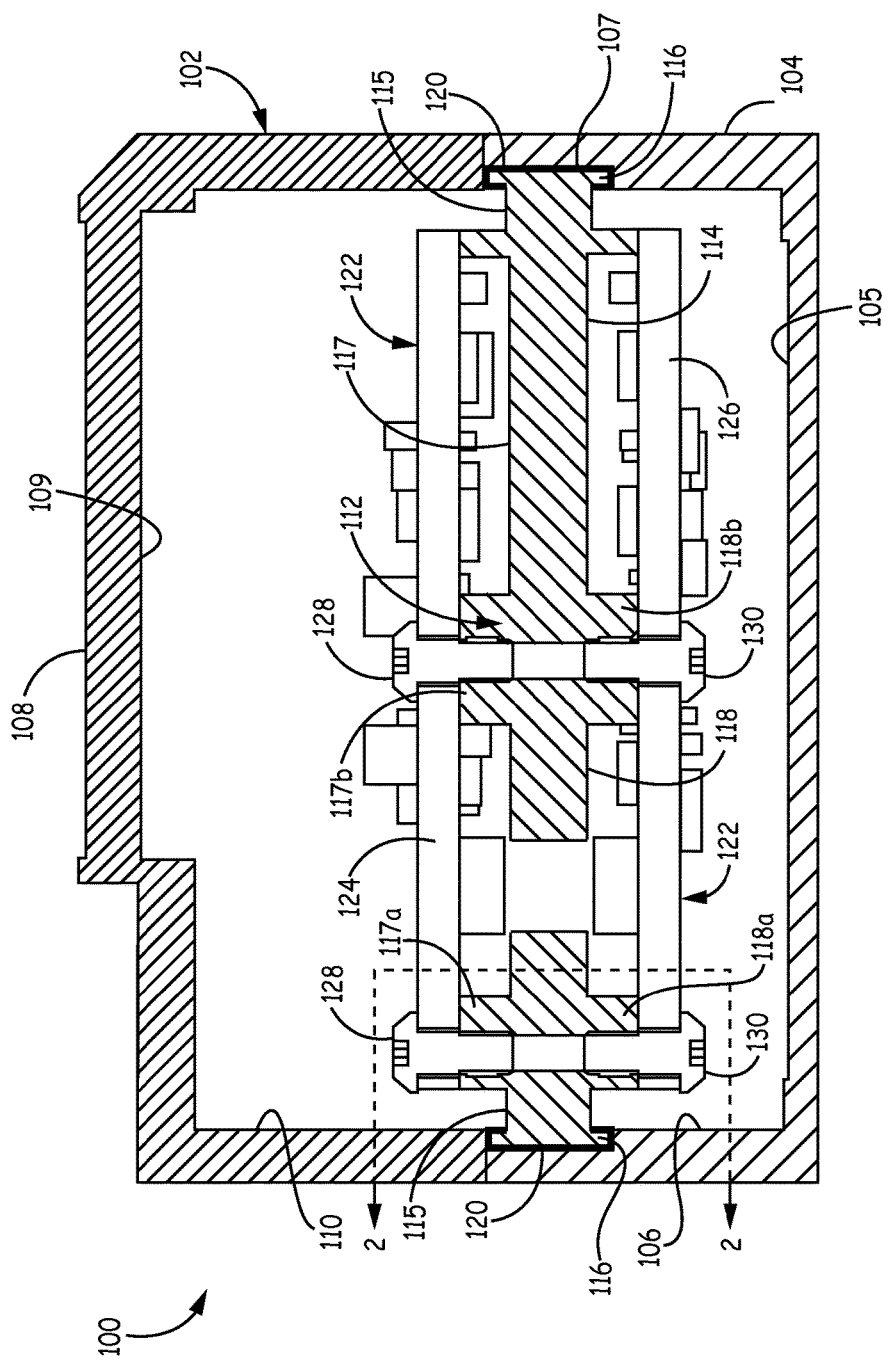
FIG. 1 is a cross-sectional side view of an environment sensor protector apparatus according to one embodiment.
Figure 2:
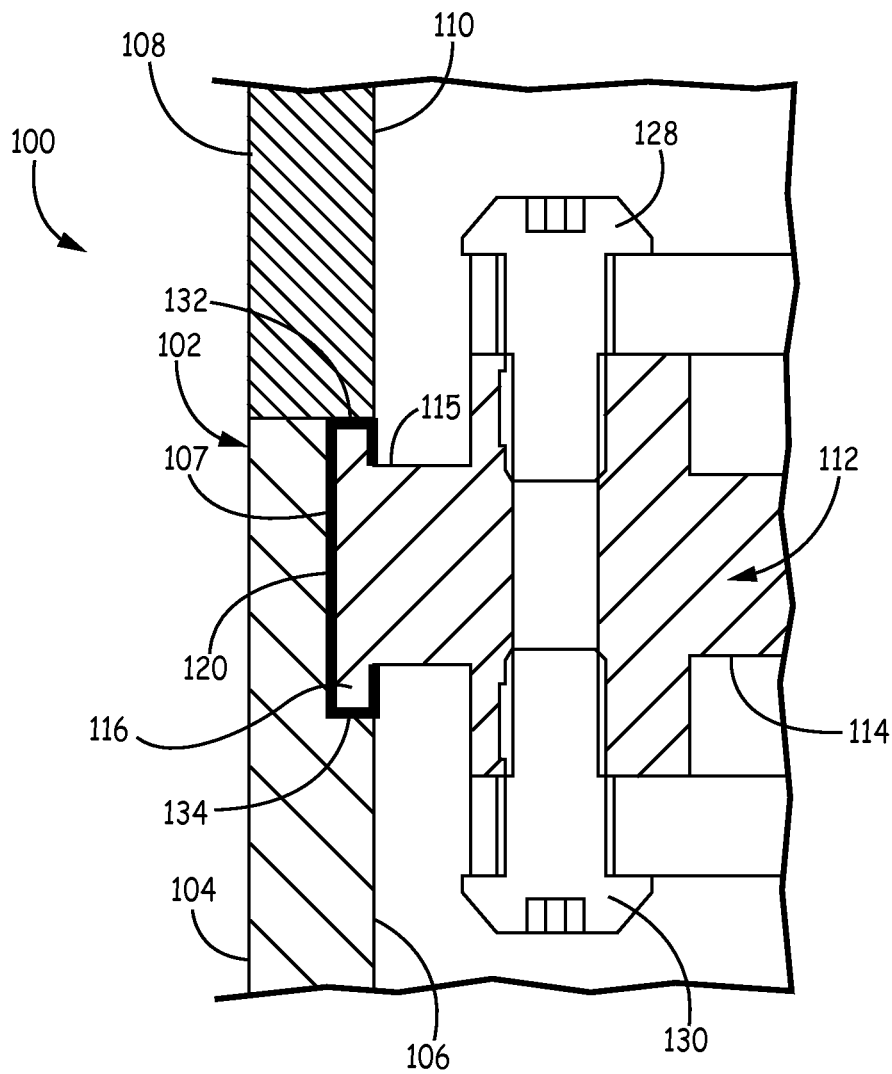
FIG. 2 is an enlarged cross-sectional side view of a portion of the environment sensor protector apparatus of FIG. 1.

FIGS. 1 and 2 illustrate an environment sensor protector apparatus 100 according to one embodiment. The sensor protector apparatus 100 generally includes a housing assembly 102, a shock mount assembly 112 contained within housing assembly 102, and an inertial sensor device 122 coupled to shock mount assembly 112. The shock mount assembly 112 is configured to support and position inertial sensor device 122 within housing assembly 102. The shock mount assembly 112 is also configured to protect inertial sensor device 122 during vibration or shock events.

The housing assembly 102 includes a lower clamp section 104 having a bottom wall 105 and a side wall 106, with an inner recess 107 formed in a portion of side wall 106. The housing assembly 102 also includes an upper clamp section 108 having a top wall 109 and a side wall 110. The clamp sections 104 and 108 are joined together to enclose and protect inertial sensor device 122. In an alternative embodiment, an inner recess can also be formed in a portion of side wall 110 of upper clamp section 108, such that the inner recess in sidewall 110 is contiguous with inner recess 107 when clamp sections 104 and 108 are joined together.

The shock mount assembly 112 includes a support structure 114 having a side wall 115 with a flange-shaped outer edge section 116 that defines a periphery of support structure 114. The support structure 114 also includes a first sensor mounting surface 117 and an opposing second sensor mounting surface 118 that both extend inwardly from side wall 115. The sensor mounting surface 117 includes a set of hollow protrusions 117a and 117b, while sensor mounting surface 118 includes a set of hollow protrusions 118a and 118b. The hollow protrusions 117a, 117b and 118a, 118b are configured for attaching inertial sensor device 122 to support structure 114. The support structure 114 can be manufactured with an aluminum alloy or other rigid material.

A shock absorber 120 is coupled to at least a portion of outer edge section 116 such that shock absorber 120 substantially surrounds the periphery of support structure 114. The shock absorber 120 comprises a shock absorbing material such as an elastomer material, or other similar materials capable of attenuating frequencies caused by shocks and vibrations, such as materials with damping characteristics. In one implementation, the elastomer material can be formed and shaped by an injection molding process. For example, an elastomer material such as silicone rubber can be injection molded under high temperature and pressure, with the silicone rubber bonding to the surfaces of outer edge section 116.

In various embodiments, the feature geometry of shock mount assembly 112, such as contact area, elastomer material thickness, and elastomer material properties, can be tuned to meet the performance requirement of inertial sensor device 122. Such feature geometry can be molded, formed, machined, cut, stamped, or cast into the required shape, and used with an elastomer material that will meet system requirements.

In one embodiment, inertial sensor device 122 includes a plurality of micro-electro-mechanical systems (MEMS) sensors 124 and 126, which are respectively coupled over first mounting surface 117 and second mounting surface 118 in a non-isolated configuration. In one embodiment, MEMS sensor 124 is coupled with a series of bolts 128 inserted into hollow protrusions 117a and 117b. Likewise, MEMS sensor 126 is coupled with a series of bolts 130 inserted into hollow protrusions 118a and 118b.

In one implementation, MEMS sensors 124 and 126 can include multiple accelerometers and gyroscopes. For example, MEMS sensors 124 and 126 can be part of an inertial measurement unit (IMU), which includes three accelerometers that aid in measuring acceleration along three orthogonal axes, and three gyroscopes that provide measurements of rotation about three orthogonal axes.

As shown in FIG. 2, flange-shaped outer edge section 116 with shock absorber 120 thereon is geometrically shaped to contiguously fit into inner recess 107 of side wall 106 of lower clamp section 104. With upper clamp section 108 joined to lower clamp section 104, outer edge section 116 and shock absorber 120 are interposed between an upper clamp joint 132 and a lower clamp joint 134. This secures support structure 114 within housing assembly 102. In this configuration, support structure 114 interfaces with both clamp section 104 and clamp section 108 through shock absorber 120 on outer edge section 116.

The shock absorber 120 functions to prevent rigid surfaces of outer edge section 116 from contacting rigid surfaces of clamp sections 104 and 108. This attenuates shocks and vibrations that affect the operation of the MEMS sensors. The frequency response of shock absorber 120 can be controlled by altering its material characteristics, as well as the compressive force that is applied to shock absorber 120 by clamp sections 104 and 108. Exemplary material characteristics that can be altered to control the frequency response of shock absorber 120 include its thickness, shape, damping characteristics, and rigidity. In addition, a temperature delta across the interface of shock absorber 120 and support structure 114 is very low (e.g., less than about 5° C.).

Figure 3A:
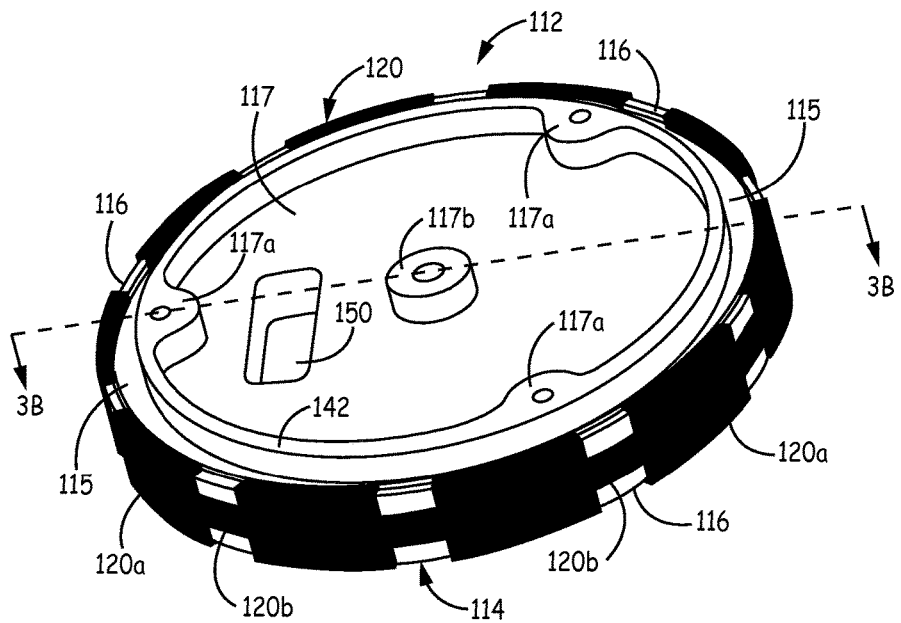
FIG. 3A is a perspective view of a shock mount assembly that can be used in the environment sensor protector apparatus of FIG. 1, according to one embodiment.
Figure 3B:
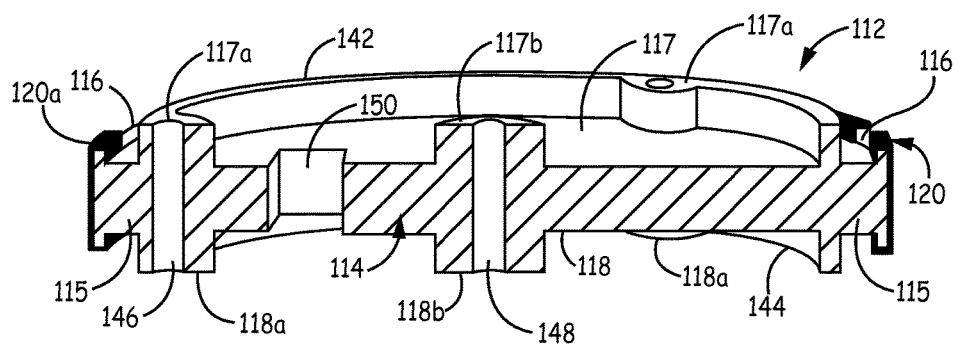
FIG. 3B is a cross-sectional side view of the shock mount assembly of FIG. 3A.

FIGS. 3A and 3B illustrate further details of shock mount assembly 112, shown separately from environment sensor protector apparatus 100. As shown, support structure 114 has a circular geometric configuration, with flange-shaped outer edge section 116 of side wall 115 defining a periphery of support structure 114. In one embodiment, shock absorber 120 includes a plurality of shock absorbing segments 120a mounted on outer edge section 116 and substantially surrounding support structure 114. Each of shock absorbing segments 120a are connected to adjacent shock absorbing segments 120a by connecting segments 120b, which are sized to leave a portion of outer edge section 116 exposed.

As depicted in FIG. 3A, a retaining ring 142 is located on sensor mounting surface 117 adjacent to side wall 115. In this embodiment, three hollow protrusions portions 117a on sensor mounting surface 117 are formed as part of retaining ring 142, while a single hollow protrusion 117b is centrally located within retaining ring 142 on sensor mounting surface 117. As shown in FIG. 3B, a retaining ring 144 is located on sensor mounting surface 118 directly opposite to retaining ring 142. The hollow protrusions 118a on sensor mounting surface 118 are formed as part of retaining ring 144, while a single hollow protrusion 118b is centrally located within retaining ring 144. The hollow protrusions 117a are directly opposite to and communicate with respective hollow protrusions 118a, with an aperture 146 extending through and between the respective hollow protrusions. Likewise, hollow protrusion 117b is directly opposite to and communicates with hollow protrusion 118b, with an aperture 148 extending through and between these hollow protrusions.

In addition, an aperture 150 extends through support structure 114 between sensor mounting surfaces 117 and 118. The aperture 150 provides a pathway for connectors to protrude through support structure 114 so that MEMS sensors 124 and 126 (FIG. 1) can be electrically connected together.

The apertures 146 and 148 are configured to receive bolts for coupling an inertial sensor device to support structure 114. In one embodiment, an inertial sensor device such as an IMU with a circular configuration can be coupled to support structure 114.

Figure 4A:
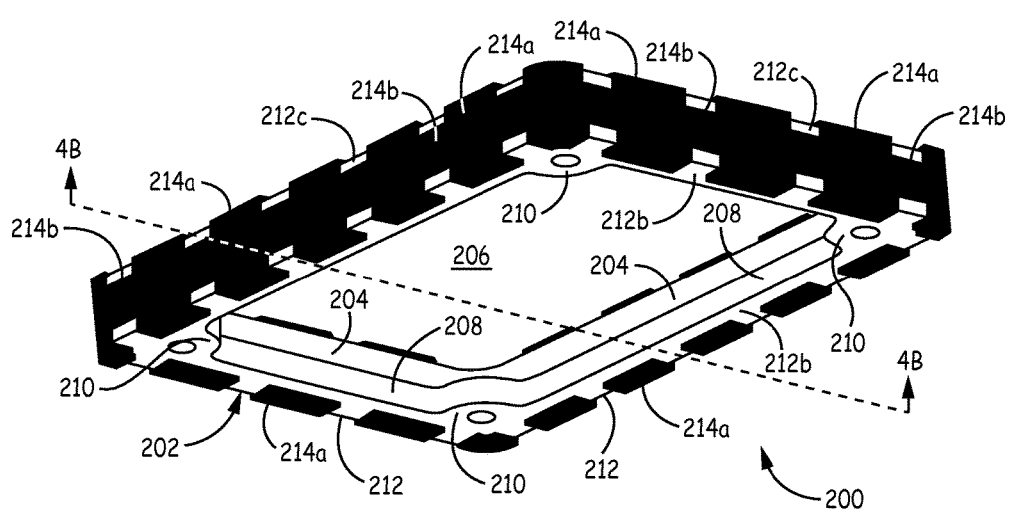
FIG. 4A is a perspective view of a shock mount assembly according to another embodiment.
Figure 4B:
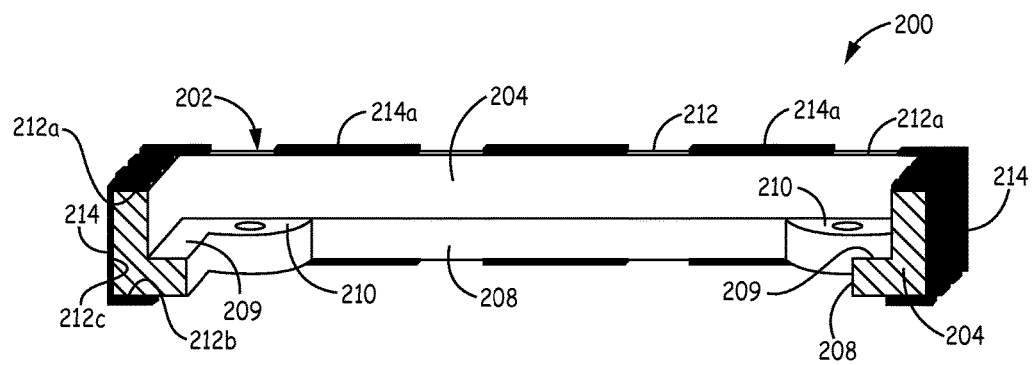
FIG. 4B is a cross-sectional side view of the shock mount assembly of FIG. 4A.

FIGS. 4A and 4B illustrate a shock mount assembly 200, according to another embodiment, which can be employed in an environment sensor protector. As shown, shock mount assembly 200 includes a support structure 202 having a rectangular geometric configuration. The support structure 202 includes a plurality of side walls 204 that enclose an open area 206. An internal ledge 208 having a mounting surface 209 extends perpendicular to each of side walls 204 into open area 206. The ledge 208 includes hollow protrusions 210 at each corner of support structure 202. The hollow protrusions 210 are configured to receive bolts for coupling an inertial sensor device to support structure 202. As shown in FIG. 4B, the combination of sidewalls 204 and ledge 208 gives support structure 202 an L-shaped cross-sectional profile.

The sidewalls 204 have an outer edge section 212, which defines a periphery of support structure 202. The outer edge section 212 includes an upper surface 212a, a lower surface 212b, and a side surface 212c that extends between upper surface 212a and lower surface 212b. A shock absorber 214 is mounted to outer edge section 212 and substantially surrounds support structure 202. The shock absorber 214 includes a plurality of shock absorbing segments 214a that are each coupled to upper surface 212a, lower surface 212b, and side surface 212c of outer edge section 212. Each of shock absorbing segments 214a are connected to adjacent shock absorbing segments 214a by connecting segments 214b, which are sized to leave a portion of side surface 212c exposed.

In one embodiment, an inertial sensor device such as an IMU with a rectangular configuration can be coupled to support structure 202. The shock mount assembly 200 is configured for a non-isolated system, and protects the inertial sensor device during vibration or shock events.

Figure 5:
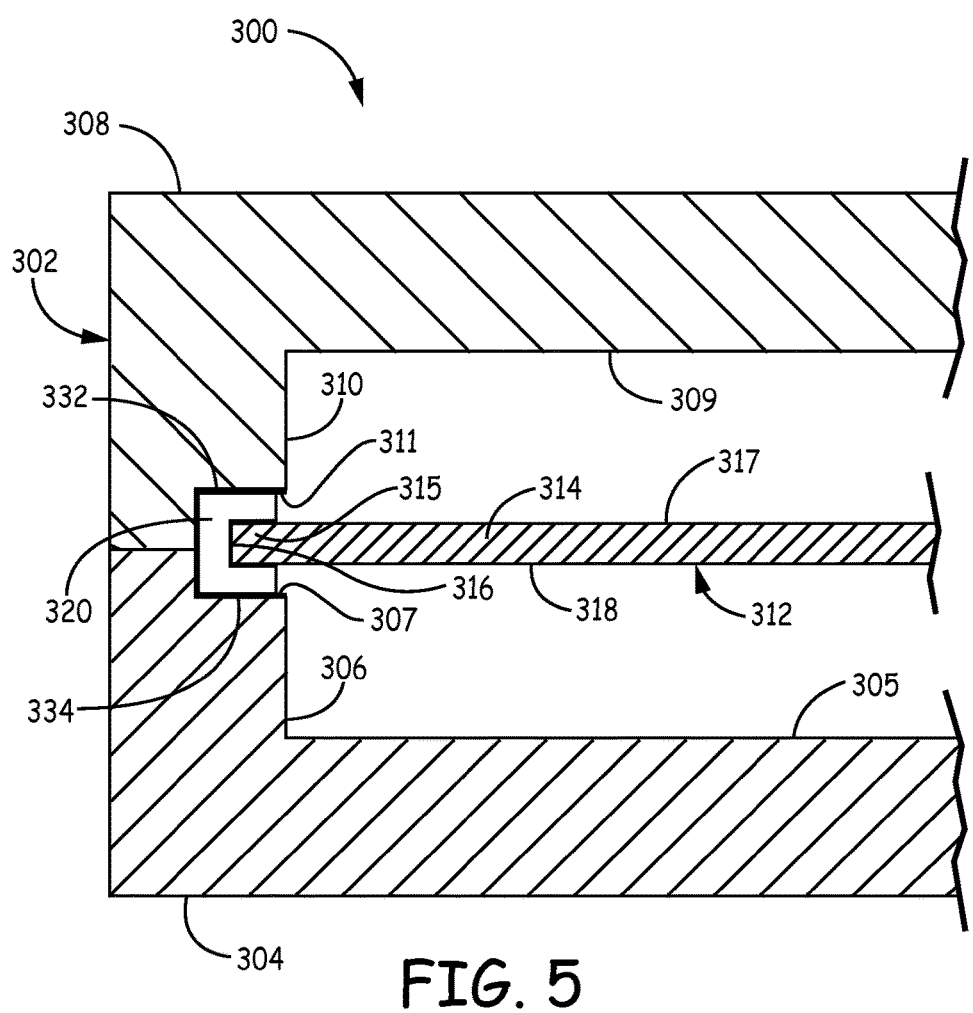
FIG. 5 is a partial cross-sectional side view of a shock mount structure in a protector apparatus, according to another embodiment.

FIG. 5 illustrates a shock mount in a protector apparatus 300, according to another embodiment. The protector apparatus 300 generally includes a housing assembly 302, and a shock mount assembly 312 contained within housing assembly 302. The shock mount assembly 312 in housing assembly 302 is configured to protect electronic devices contained therein during vibration or shock events.

The housing assembly 302 includes a lower clamp section 304 having a bottom wall 305 and a side wall 306, with an inner recess 307 formed in a portion of side wall 306. The housing assembly 302 also includes an upper clamp section 308 having a top wall 309 and a side wall 310, with an inner recess 311 formed in a portion of side wall 310.

The shock mount assembly 312 includes a support structure 314 having a side wall 315 with an outer edge section 316 that defines a periphery of support structure 314. The support structure 314 also includes a first device mounting surface 317 and an optional second device mounting surface 318 on an opposite side. In various embodiments, support structure 314 can be a printed circuit board, a printed wiring board, a structure that a sensor can be mounted to (e.g., a stand alone sensor or sensor(s) mounted via a printed wiring assembly), or the like.

A shock absorber 320 is coupled to at least a portion of outer edge section 316 such that shock absorber 320 substantially surrounds the periphery of support structure 314. The shock absorber 320 comprises a shock absorbing material such as an elastomer material, or other similar material that is capable of attenuating frequencies caused by shocks and vibrations.

As shown in FIG. 5, outer edge section 316 with shock absorber 320 thereon is geometrically shaped to contiguously fit into inner recesses 307 and 311. With upper clamp section 308 joined to lower clamp section 304, outer edge section 316 and shock absorber 320 are interposed between an upper clamp joint 332 and a lower clamp joint 334. This secures support structure 314 within housing assembly 302.

Figure 6:
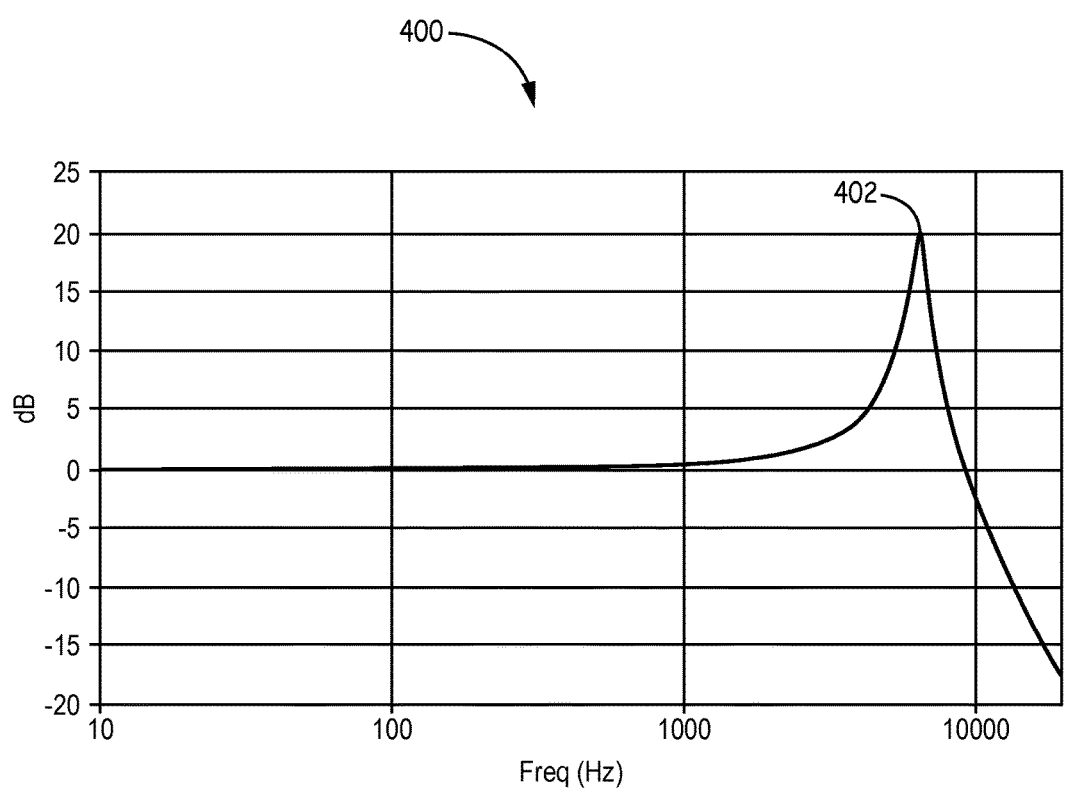
FIG. 6 is a graph of response with respect to frequency for a shock filter model.

FIG. 6 is a graph 400 that represents the frequency responses of an ideal shock filter (shock absorber) of a $2^{nd}$ order system, with a resonant frequency of about 6000 Hz and a peak transmissibility of 20 dB. The frequency response is the resultant motion of the shock filter divided by the input to the shock filter over a frequency range. In a system, such as the present shock mount assembly, the frequency response (transmissibility) is about 1 (or 0 dB) at low frequency; in graph 400 this would be below about 100 Hz. Any value that is above 1 (+dB) there is amplification, and any value that is below 1 (−dB) there is attenuation. In this example, the shock filter has a frequency response of 0 dB in the lower frequency range and amplifies to 20 dB at a peak 402, which is around the natural frequency (resonance) of about 6000 Hz for the system. This is an acceptable frequency response for various sensor embodiments. In sensor systems that experience frequencies above 10,000 Hz during a shock event, various performance issues can arise. As shown in graph 400, the shock filter attenuates higher frequency energy, such as above 10,000 Hz, which allows for improved sensor performance.

Example Embodiments

Example 1 includes a shock mount assembly comprising: a support structure having a geometric configuration, the support structure comprising at least one side wall having an outer edge section that defines a periphery of the support structure, and a first mounting surface substantially perpendicular to the side wall, the first mounting surface configured for coupling at least one electronic device to the support structure; and a shock absorber mounted to at least a portion of the outer edge section, the shock absorber substantially surrounding the periphery of the support structure; wherein the shock mount assembly is configured for a non-isolated system, the shock mount assembly configured to protect the electronic device during vibration or shock events.

Example 2 includes the shock mount assembly of Example 1, wherein the support structure has a circular geometric configuration.

Example 3 includes the shock mount assembly of Example 1, wherein the support structure has a rectangular geometric configuration.

Example 4 includes the shock mount assembly of any of Examples 1-2, wherein the support structure further comprises a second mounting surface on an opposite side from the first mounting surface, the second mounting surface configured for coupling at least one electronic device to the support structure.

Example 5 includes the shock mount assembly of any of Examples 1-4, wherein the at least one electronic device comprises a sensor device.

Example 6 includes the shock mount assembly of any of Examples 4-5, wherein the first and second mounting surfaces are configured for coupling inertial sensor devices to the support structure.

Example 7 includes the shock mount assembly of any of Examples 1-6, wherein the shock absorber comprises an elastomer material.

Example 8 includes the shock mount assembly of any of Examples 1-7, wherein the shock absorber comprises a plurality of shock absorbing segments coupled to the outer edge section, each of the shock absorbing segments connected to adjacent shock absorbing segments by a connecting segment that is sized to leave a portion of the outer edge section exposed.

Example 9 includes the shock mount assembly of any of Examples 3, 5, 7, and 8, further comprising a plurality of side walls that enclose an open area, wherein the first mounting surface is part of an internal ledge that extends into the open area from the side walls, the ledge including hollow protrusions at each corner of the support structure, the hollow protrusions configured for coupling the electronic device to the support structure.

Example 10 includes the shock mount assembly of Example 9, wherein the sidewalls and the ledge extending therefrom give the support structure an L-shaped cross-sectional profile.

Example 11 includes a sensor protector apparatus comprising: a housing assembly comprising a first clamp section having at least one side wall, and a second clamp section having at least one side wall, the second clamp section coupled to the first clamp section, wherein at least one of the first clamp section and the second clamp section has an inner recess along their respective side walls; a shock mount assembly within the housing assembly, the shock mount assembly comprising: a support structure having a geometric configuration, the support structure comprising at least one side wall having an outer edge section that defines a periphery of the support structure, and a first mounting surface perpendicular to the side wall; a shock absorber mounted to at least a portion of the outer edge section, the shock absorber substantially surrounding the periphery of the support structure; wherein the outer edge section and the shock absorber are geometrically shaped to contiguously fit within the inner recess; and at least one sensor device coupled over the first mounting surface of the support structure in a non-isolated configuration; wherein the shock mount assembly is configured to protect the sensor device during vibration or shock events.

Example 12 includes the sensor protector apparatus of Example 11, wherein the support structure further comprises a second mounting surface on an opposite side from the first mounting surface.

Example 13 includes the sensor protector apparatus of Example 12, further comprising at least one sensor device coupled to the second mounting surface.

Example 14 includes the sensor protector apparatus of any of Examples 11-13, wherein the sensor devices comprise inertial sensor devices.

Example 15 includes the sensor protector apparatus of Example 14, wherein the inertial sensor devices comprise MEMS inertial sensors.

Example 16 includes the sensor protector apparatus of Example 15, wherein the MEMS inertial sensors include a plurality of accelerometers and gyroscopes that are part of an inertial measurement unit.

Example 17 includes the sensor protector apparatus of any of Examples 11-16, wherein the shock absorber comprises an elastomer material.

Example 18 includes the sensor protector apparatus of any of Examples 11-17, wherein the shock absorber comprises a plurality of shock absorbing segments coupled to the outer edge section, each of the shock absorbing segments connected to adjacent shock absorbing segments by a connecting segment that is sized to leave a portion of the outer edge section exposed.

Example 19 includes the sensor protector apparatus of any of Examples 11-18, wherein the support structure has a circular geometric configuration.

Example 20 includes the sensor protector apparatus of any of Examples 14-18, wherein the support structure has a rectangular geometric configuration.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A shock mount assembly, comprising:
    a support structure having a geometric configuration, the support structure comprising:
        at least one side wall having an outer edge section that defines a periphery of the support structure; and
        a first mounting surface substantially perpendicular to the side wall, the first mounting surface configured for coupling at least one electronic device to the support structure; and
    a shock absorber mounted to at least a portion of the outer edge section, the shock absorber substantially surrounding the periphery of the support structure;
    wherein the shock mount assembly is configured for a non-isolated system, the shock mount assembly configured to protect the electronic device during vibration or shock events.

2. The shock mount assembly of claim 1, wherein the support structure has a circular geometric configuration.

3. The shock mount assembly of claim 1, wherein the support structure has a rectangular geometric configuration.

4. The shock mount assembly of claim 1, wherein the support structure further comprises a second mounting surface on an opposite side from the first mounting surface, the second mounting surface configured for coupling at least one electronic device to the support structure.

5. The shock mount assembly of claim 1, wherein the at least one electronic device comprises a sensor device.

6. The shock mount assembly of claim 4, wherein the first and second mounting surfaces are configured for coupling inertial sensor devices to the support structure.

7. The shock mount assembly of claim 1, wherein the shock absorber comprises an elastomer material.

8. The shock mount assembly of claim 1, wherein the shock absorber comprises a plurality of shock absorbing segments coupled to the outer edge section, each of the shock absorbing segments connected to adjacent shock absorbing segments by a connecting segment that is sized to leave a portion of the outer edge section exposed.

9. The shock mount assembly of claim 3, further comprising a plurality of side walls that enclose an open area, wherein the first mounting surface is part of an internal ledge that extends into the open area from the side walls, the ledge including hollow protrusions at each corner of the support structure, the hollow protrusions configured for coupling the electronic device to the support structure.

10. The shock mount assembly of claim 9, wherein the sidewalls and the ledge extending therefrom give the support structure an L-shaped cross-sectional profile.

11. A sensor protector apparatus, comprising:
    a housing assembly comprising:
        a first clamp section having at least one side wall; and
        a second clamp section having at least one side wall, the second clamp section coupled to the first clamp section;
        wherein at least one of the first clamp section and the second clamp section has an inner recess along their respective side walls;
    a shock mount assembly within the housing assembly, the shock mount assembly comprising:
        a support structure having a geometric configuration, the support structure comprising:
            at least one side wall having an outer edge section that defines a periphery of the support structure; and
            a first mounting surface perpendicular to the side wall; and
        a shock absorber mounted to at least a portion of the outer edge section, the shock absorber substantially surrounding the periphery of the support structure;

wherein the outer edge section and the shock absorber are geometrically shaped to contiguously fit within the inner recess; and at least one sensor device coupled over the first mounting surface of the support structure in a non-isolated configuration;

wherein the shock mount assembly is configured to protect the sensor device during vibration or shock events.

12. The sensor protector apparatus of claim 11, wherein the support structure further comprises a second mounting surface on an opposite side from the first mounting surface.

13. The sensor protector apparatus of claim 12, further comprising at least one sensor device coupled to the second mounting surface.

14. The sensor protector apparatus of claim 13, wherein the sensor devices comprise inertial sensor devices.

15. The sensor protector apparatus of claim 14, wherein the inertial sensor devices comprise micro-electro-mechanical systems (MEMS) inertial sensors.

16. The sensor protector apparatus of claim 15, wherein the MEMS inertial sensors include a plurality of accelerometers and gyroscopes that are part of an inertial measurement unit.

17. The sensor protector apparatus of claim 11, wherein the shock absorber comprises an elastomer material.

18. The sensor protector apparatus of claim 11, wherein the shock absorber comprises a plurality of shock absorbing segments coupled to the outer edge section, each of the shock absorbing segments connected to adjacent shock absorbing segments by a connecting segment that is sized to leave a portion of the outer edge section exposed.

19. The sensor protector apparatus of claim 11, wherein the support structure has a circular geometric configuration.

20. The sensor protector apparatus of claim 11, wherein the support structure has a rectangular geometric configuration.

* * * * *